(12) United States Patent
Solbrekken et al.

(10) Patent No.: US 6,523,608 B1
(45) Date of Patent: Feb. 25, 2003

(54) THERMAL INTERFACE MATERIAL ON A MESH CARRIER

(75) Inventors: Gary L. Solbrekken, Minneapolis, MN (US); Craig B. Simmons, Chandler, AZ (US); Chia-Pin Chiu, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/629,119

(22) Filed: Jul. 31, 2000

(51) Int. Cl.[7] .................................................. F28F 7/00
(52) U.S. Cl. ........................ 165/185; 165/80.3; 361/708
(58) Field of Search ................................ 165/185, 80.2, 165/80.3; 361/704, 712, 708; 257/713, 714, 715, 719

(56) References Cited

U.S. PATENT DOCUMENTS

| | | | |
|---|---|---|---|
| 4,446,916 A | | 5/1984 | Hayes |
| 4,529,836 A | | 7/1985 | Powers et al. |
| 4,654,754 A | * | 3/1987 | Daszkowski ................. 165/185 |
| 4,685,987 A | * | 8/1987 | Fick ............................ 165/185 |
| 4,915,167 A | * | 4/1990 | Altoz .......................... 165/185 |
| 5,141,050 A | * | 8/1992 | Schuft ......................... 165/185 |
| 5,198,189 A | * | 3/1993 | Booth et al. ................. 420/555 |
| 5,223,347 A | * | 6/1993 | Lhymn et al. ............... 428/614 |
| 5,268,414 A | * | 12/1993 | Nakai et al. ................. 524/539 |
| 5,323,294 A | * | 6/1994 | Layton et al. ............... 165/185 |
| 5,419,357 A | * | 5/1995 | Lhymn et al. ............... 428/614 |
| 5,528,456 A | * | 6/1996 | Takahashi .................... 361/704 |
| 5,658,831 A | | 8/1997 | Layton et al. |
| 5,725,694 A | * | 3/1998 | Sircar ........................... 148/439 |
| 5,775,219 A | * | 7/1998 | Shimazu et al. ............. 101/123 |
| 5,783,862 A | * | 7/1998 | Deeney ........................ 165/185 |
| 5,842,626 A | * | 12/1998 | Bhansali et al. ........ 228/180.22 |
| 5,938,862 A | * | 8/1999 | Yeh et al. .................... 148/400 |
| 5,945,217 A | * | 8/1999 | Hanrahan .................... 428/389 |
| 6,033,488 A | * | 3/2000 | An et al. ...................... 148/24 |
| 6,054,198 A | * | 4/2000 | Bunyan et al. .............. 428/40.5 |
| 6,131,646 A | * | 10/2000 | Kelley ......................... 165/80.1 |
| 6,281,040 B1 | * | 8/2001 | McCormack et al. ........ 438/106 |

FOREIGN PATENT DOCUMENTS

| | | |
|---|---|---|
| JP | 63186881 | 2/1988 |
| WO | WO99/30365 | 6/1999 |

OTHER PUBLICATIONS

"Grid Matrix Thermal Interface Material Carrier," IBM Technical Disclosure Bulletin, IBM Corp., vol. 38, NR. 10, Oct. 1995, pp. 407–408, XP000540542. ISSN: 0018–8689, New York, USA.
International Search Report, European Patent Office, Date of Mailing: May 16, 2002, International Application No.: PCT/US 01/22960, International Filing Date: Jul. 20, 2001, pp. 1–4.

* cited by examiner

*Primary Examiner*—Spe Au
*Assistant Examiner*—Temell McKinnon
(74) *Attorney, Agent, or Firm*—Robert G. Winkle

(57) ABSTRACT

A thermal interface comprising a grid frame having a thermally conductive interface material coated thereon. The thermal interface is disposed between a heat source and a heat dissipation device wherein the thermally conductive material preferably melts at a temperature at or below the temperature of the heat source.

22 Claims, 5 Drawing Sheets

THERMAL INTERFACE MATERIAL ON A MESH CARRIER

BACKGROUND OF TEE INVENTION

1. Field of the Invention

The present invention relates to apparatus and methods for removal of heat from electronic devices. In particular, the present invention relates to a thermal interface comprising a grid frame coated with a thermal interface material, wherein the coated grid frame is disposed between a heat generating source, such as a microelectronic die, and a heat dissipation device, such as a heat spreader or heat sink.

2. State of the Art

Higher performance, lower cost, increased miniaturization of integrated circuit components, and greater packaging density of integrated circuits are ongoing goals of the microelectronic and computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of a heat dissipation device to a microelectronic die. FIG. 4 illustrates an assembly 200 comprising a microelectronic die 202 (illustrated as a flip chip) physically and electrically attached to a carrier substrate 204 by a plurality of solder balls 206. A back surface 216 of a heat dissipation device 208 may be attached to a back surface 212 of the microelectronic die 202 by a thermally conductive adhesive or solder 214. The heat dissipation device 208 may be a heat pipe, as known in the art, or a heat slug constructed from a thermally conductive material, such as copper, copper alloys, aluminum, aluminum alloys, and the like.

However, the use of a rigid thermally conductive adhesive or solder 214 can cause stresses in the microelectronic die 202 due to a mismatch between coefficients of thermal expansion ("CTE") of the heat dissipation device 208 and the microelectronic die 202 as the microelectronic die 202 heats to a normal operating temperature when on and room temperature when off. Stresses due to CTE mismatch increase the probability that cracks will initiate and propagate in the microelectronic die 202, which may cause the failure of the microelectronic die 202. Furthermore, in order to get the solder materials to adhere to the microelectronic die back surface 212 and the heat dissipation device back surface 216, a gold coating may to be applied to both surfaces, which is prohibitively expensive.

In another known embodiment as shown in FIG. 5, a pin grid array-type ("PGA") microelectronic die 222 is placed in a socket 224 mounted on the carrier substrate 204, wherein pins 226 extending from the PGA microelectronic die 222 make electrical contact with conductive vias 228 in the socket 224. The socket 224 is, in turn, in electrical contact (not shown) with the carrier substrate 204. The heat dissipation device 208 (shown as a finned heat sink having a plurality of fins 232) is kept in contact with the microelectronic die 222 with a spring clip 234 which spans the heat dissipation device 208 and connects to the socket 224. A conductive grease 236 is placed between the microelectronic die 202 and the heat dissipation device 208. This configuration virtually eliminates problems with CTE mismatch.

It is also known that the conductive grease 236 of FIG. 5 may be replaced with a phase-change material or matrix. Such materials are in a substantially solid phase (paste-like consistency) when cool (i.e., room temperature). When heated (brought to operating temperatures), the phase-change material changes to a substantially liquid phase (grease-like consistency) which allows the phase-change material to conform to surface irregularites of mating surfaces (when in a solid phase the phase change material is not able to conform to all microwarpages). Therefore the liquid phase has better contact properties which results in a higher heat dissipation compared to the solid phase. One such material is Thermflow™ T443, consisting of a phase-change material within a fiberglass carrier (mat/pad) available from Chomerics, Woburn, Mass., USA.

However, as the size or "footprint" of microelectronic dice decreases, the contact area between the microelectronic die and the heat dissipation device decreases, which reduces the area available for conductive heat transfer. Thus, with a decrease of the size in the microelectronic die, heat dissipation from the heat dissipation device becomes less efficient. Furthermore, as the microelectronic die power is increased, the heat source upper temperature specifications decreases, or the external ambient temperature specification increases. Thus, every area of thermal performance must be examined for any possible enhancement. One such area is the interface between the microelectronic die and the heat dissipation device. As microelectronic dice become smaller, the heat transfer properties of the interface becomes a greater factor. Thus, currently available thermally conductive adhesives, greases, and phase-change materials generally are quickly becoming bottlenecks to heat dissipation.

Therefore, it would be advantageous to develop techniques and apparatus to improve the efficiency of heat transfer at an interface between a heat source and a heat dissipation device.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although the figures illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

Although the present invention is described in terms of microelectronic dice and microelectronic-type heat dissipation devices, it is not so limited. The present invention may be used as an interface between any applicable heat source and heat dissipation mechanism.

Figure 1:
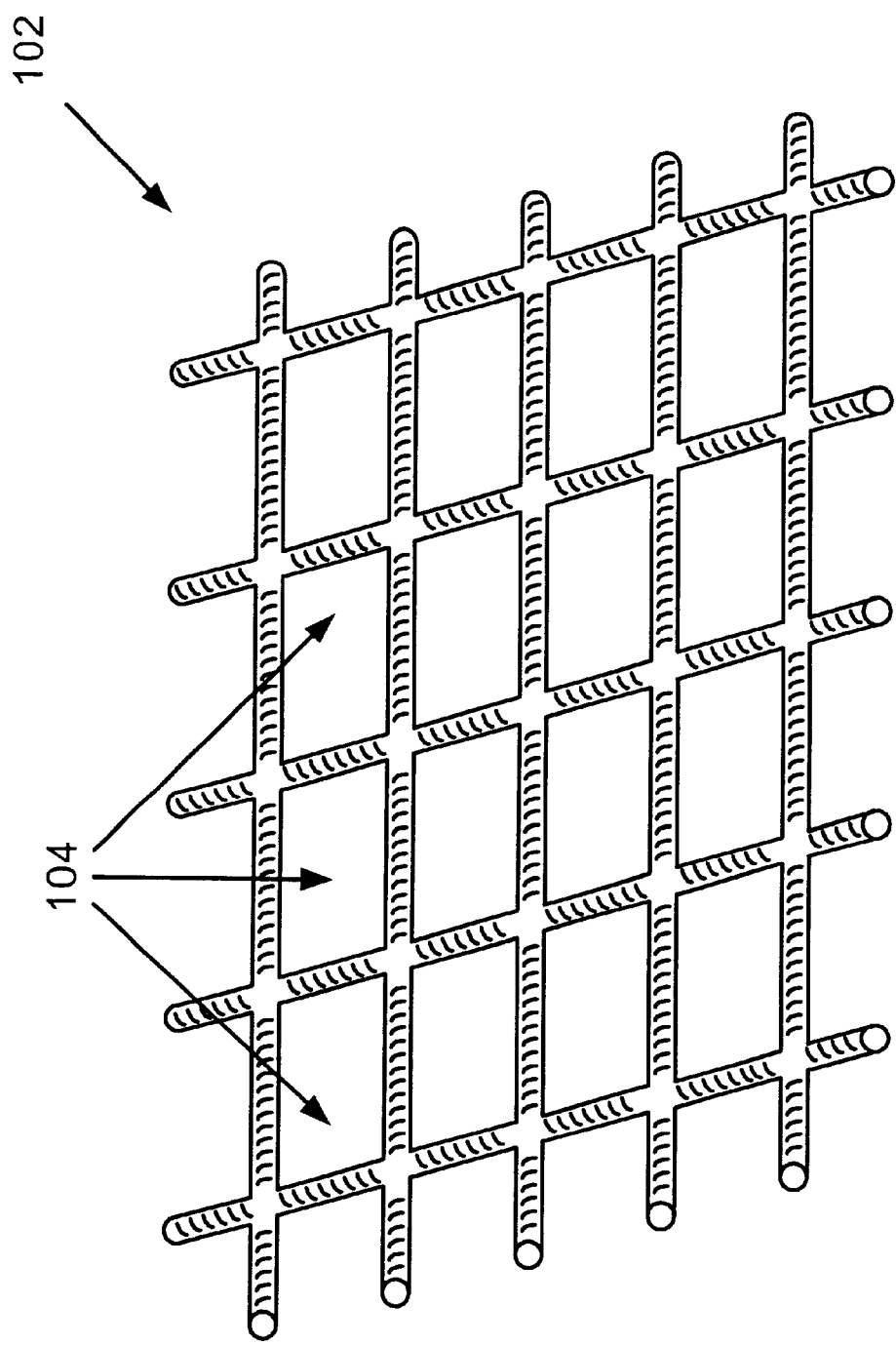
FIG. 1 is an oblique view of an embodiment of a grid frame, according to the present invention.

FIG. 1 illustrates a grid frame 102 of the present invention. The grid frame 102 may be made of a thermally conductive material including, but not limited to, aluminum, copper, nickel, stainless steel, and the like. Preferably the grid frame 102 is fabricated by providing a metal foil and placing slits/perforations therethrough. The metal foil is expanded/stretched and rolled flat. However, it is understood that numerous fabrication techniques may be employed to fabricate the grid frame 102, as will be apparent to one skilled in the art. Furthermore, although the openings 104 in the grid frame 102 are shown to be square, they may be any shape including, but not limited to, triangular, rectangular, circular, elliptical, and the like, depending on the fabrication technique.

Figure 2:
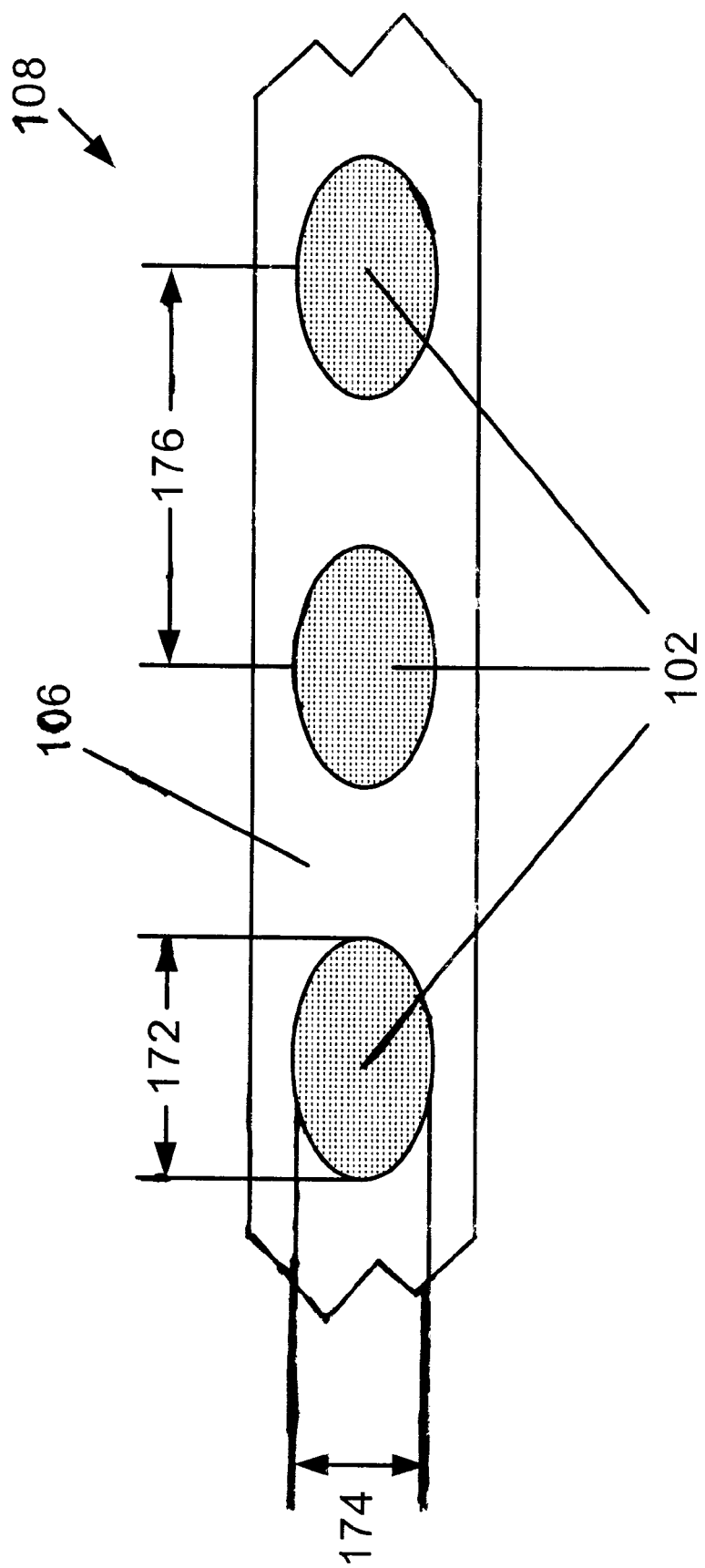
FIG. 2 is a side cross-sectional view of an embodiment of a grid frame coated with a solder material, according to the present invention.

The grid frame 102 is then coated with a thermally conductive interface material 106. FIG. 2 illustrates a cross-sectional view of the grid frame 102 coated with the thermally conductive interface material 106 to form a coated grid frame 108. The thermally conductive interface material 106 preferably has a melting temperature at or lower temperature than the temperature of the heat source to which the coated grid frame 108 will subsequently abutted. It is, of course, understood that the actual profile and depth of the coating will depend on the physical properties of the thermally conductive interface material 106 selected and the size of the openings 104 (see FIG. 1) of the grid frame 102.

Figure 3:
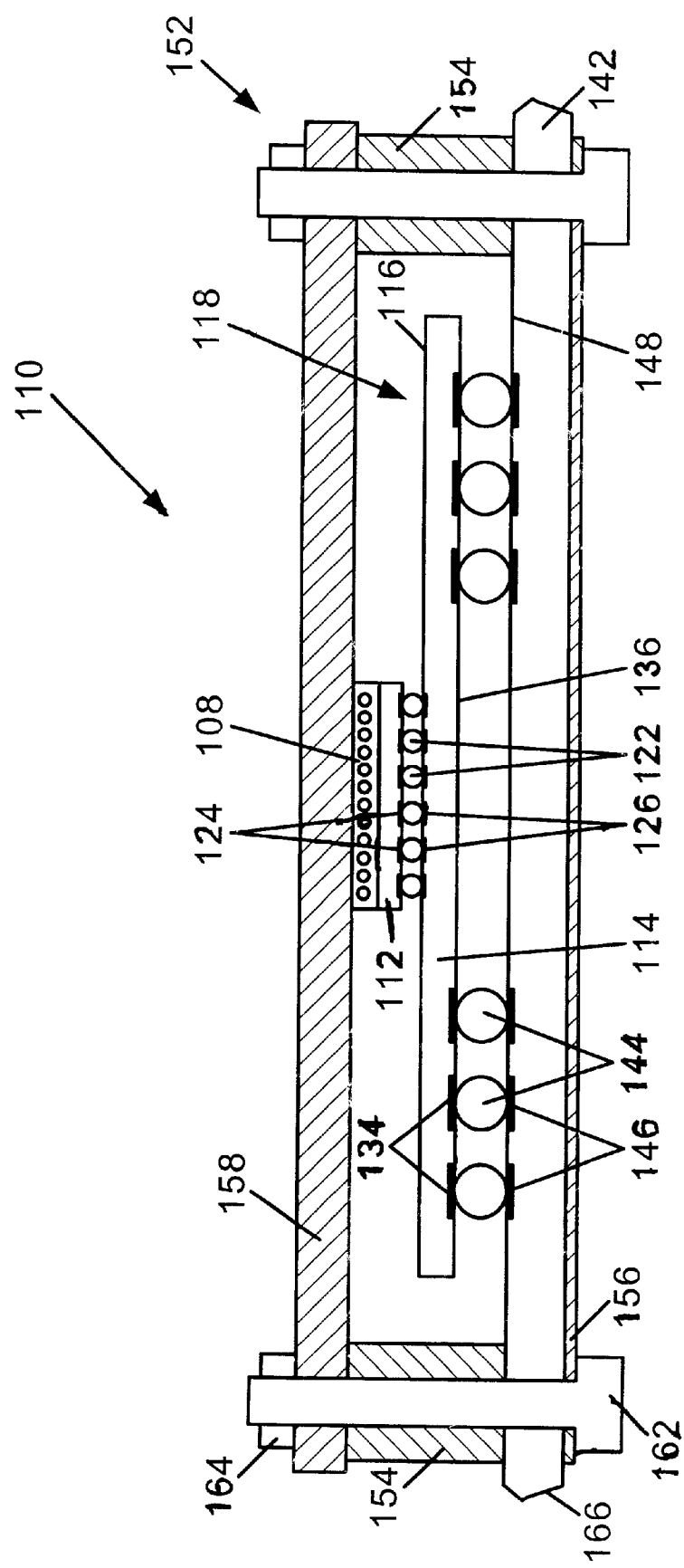
FIG. 3 is a side cross-sectional view of an embodiment of a microelectronic assembly having a coated grid frame thermal interface, according to the present invention.
Figure 4:
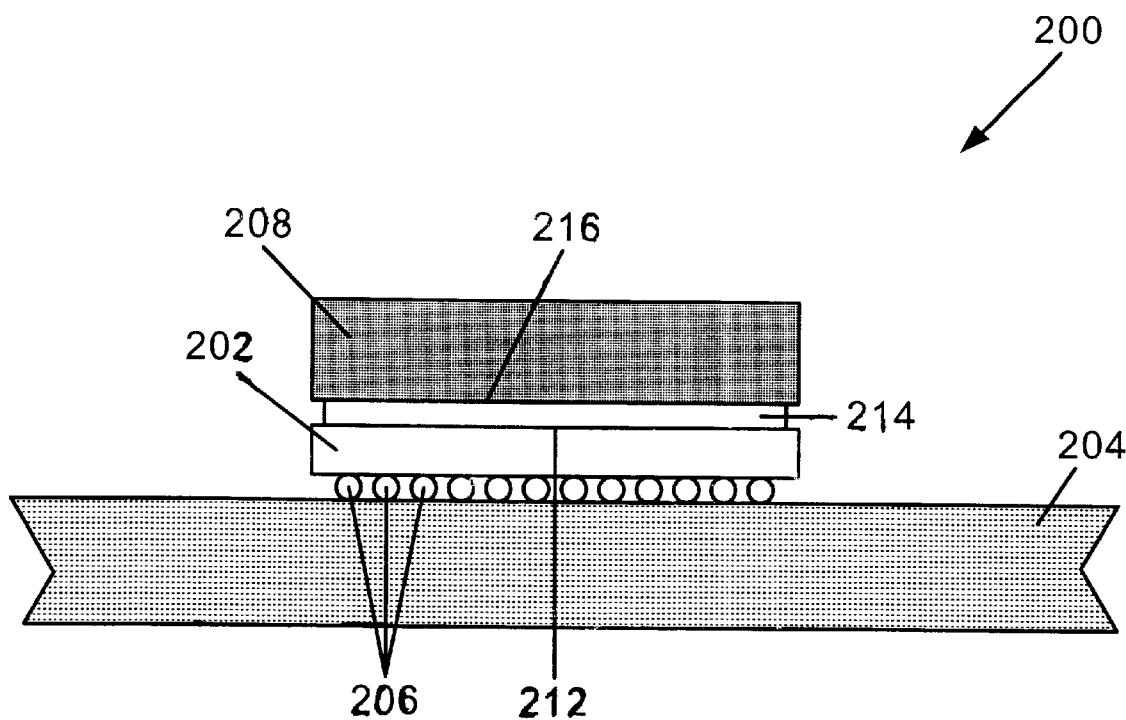
FIG. 4 is a side cross-sectional view of a heat dissipation device attached to microelectronic die, as known in the art.
Figure 5:
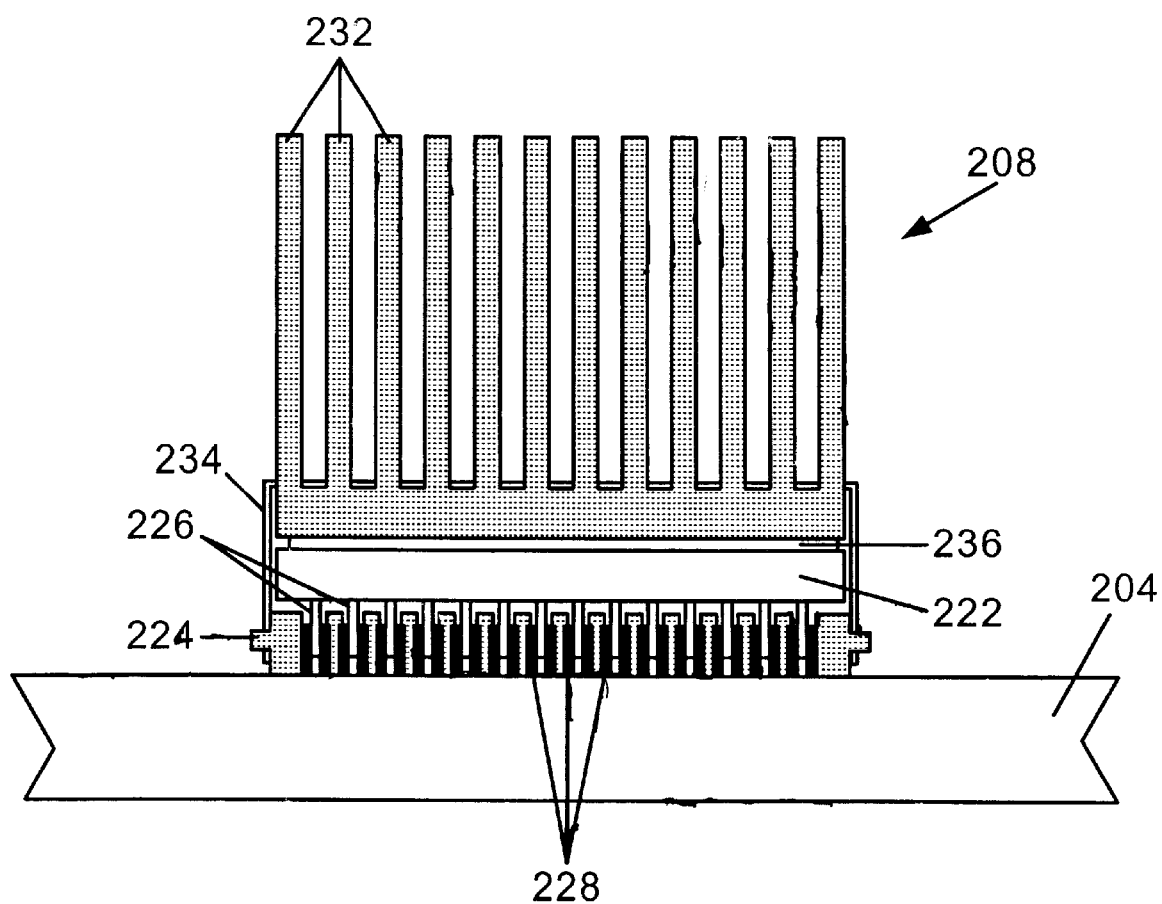
FIG. 5 is a side cross-sectional view of a heat dissipation device clipped to PGA microelectronic die, as known in the art.

FIG. 3 illustrates a microelectronic component assembly 110 according to one embodiment of the present invention. The microelectronic component assembly 10 includes a microelectronic device package 118 comprising a microelectronic die 112 attached to and in electrical contact with a first surface 116 of an interposer substrate 114. The attachment and electrical contact is achieved through a plurality of small solder balls 122 extending between contacts 124 on the microelectronic die 112 and contacts 126 on the interposer substrate first surface 116. The interposer substrate first surface contacts 126 are in discrete electrical contact with contacts 134 on a second surface 136 of the interposer substrate 114 through a plurality of conductive traces (not shown) extending through the interposer substrate 114.

The electrical contact of the microelectronic device package 118 with a carrier substrate (such as a motherboard) 142 is achieved with a plurality of solder balls 144, which are formed (reflow) on the interposer substrate second surface contacts 134. The solder balls 144 extend between the interposer substrate second surface contacts 134 and contacts 146 on a first surface 148 of the carrier substrate 142 to form an electrical contact therebetween.

The support structure 152 includes a frame 154, a backing plate 156, a heat dissipation plate 158, and a plurality of retention devices (shown as bolts 162 and nuts 164). The backing plate 156 is placed adjacent a second surface 166 of the carrier substrate 142. The frame 154 is placed adjacent to the carrier substrate first surface 148 and at least partially surrounds the microelectronic device package 118.

The coated grid frame 108 is disposed between the heat dissipation plate 158 and the microelectronic die 112. The heat dissipation plate 158 extends over the frame 154. The bolts 162 extend through the backing plate 156, the frame 154, and the heat dissipation plate 158, and are retained by nuts 164 threaded thereon. The heat dissipation plate 158 is made of a highly thermally conductive material including, but not limited to, aluminum, aluminum alloys, copper, and copper alloys. The heat dissipation plate 158 dissipates the heat generated by the microelectronic die 112. It is, of course, understood that other retention mechanisms, such as clips and the like, could be used as the support structure 152.

In one embodiment of the present invention (referring back to FIG. 2), the grid frame 102 comprises a copper mesh having a strand width 172 of about 5 mils and an overall thickness 174 of about 1.5 mils. The individual grids (see FIGS. 1 and 2) have a pitch 176 of about 50 mils. It is noted that the mesh should be as thin as viably possible.

The thermally conductive interface material 106 is selected such at it melts at or below the normal operation temperature of the microelectronic die 112. In the present embodiment, the thermally conductive interface material is a solder (and will hereinafter be designed with the "106" element numbering) having a melting temperature of about 60° C. Possible solder materials include, but are not limited to, a lead solder having about 49% Bi, about 21% In, about 18% Pb, and about 12% Sn; and a lead-free solder having about 51% In, about 32.5% Bi, and about 16.5% Sn. The exemplary lead and lead-free solders both have a melting temperature of about 60° C. The grid frame 102 can be coated with the solder 106 by melting it and dipping the grid frame 102 in the melted solder 106, such that the solder 106 completely coats the grid frame 102. It is, of course, understood that the grid frame 102 may be coated with the solder 106 using a number of techniques, as will be apparent to one skilled in the art. The coated grid frame 108 can then be placed between the heat dissipation plate 158 and the microelectronic die 112, with positive pressure therebetween induced by the support structure 152.

When the microelectronic die 112 is powered up, it generates heat, raising its temperature. Thus, when the temperature of the microelectronic die 112 is increased above the melting temperature of the solder 106, the solder 106 melts and conforms to the microelectronic die 112 and the heat dissipation plate 158 in an intimate, low thermal resistance contact therebetween. This enhances heat transfer from the microelectronic die 112 to the heat dissipation plate 158. The grid frame 102 mechanically keeps the solder 106 from running out of the interface between the microelectronic die 112 and the heat dissipation plate 158. It is believed the cohesion of the solder retains the melted solder 106 on the grid frame 102, rather than the solder 106 sticking to the grid frame. The melted solder 106 will tend to flow completely out of the interface between the microelectronic die 112 and the heat dissipation plate 158 without the grid frame 102, as the melted solder 106 generally does not wet either the microelectronic die 112 or the heat dissipation plate 158.

When the microelectronic die 112 cools below the melting point of the solder 106, the solder 106 solidifies. The melting point of the solder 106 is preferably at or above room temperature (i.e., about 72° C.). As the solder 106 cools, a weak adhesion develops between the solder 106 and either or both of the microelectronic die 112 and the heat dissipation plate 158. Thus, the CTE mismatch will result in the de-coupling the microelectronic die 112 from the heat dissipation plate 158, thereby eliminating stresses caused by CTE mismatch. In other words, the solidified solder 106 breaks free from the microelectronic die and/or the heat dissipation plate 158. Furthermore, no special coating for the microelectronic die 112 and/or the heat dissipation plate 158 is needed.

In a comparison between the above described grid frame (i.e., 1.5 mil copper with a 50 mil pitch) with the lead solder coating (about 49% Bi, about 21% In, 18% Pb, 12% Sn) and the commercially available Thermflow™ T443, the embodiment of the present invention demonstrated a thermal resistance of about 0.3° C./W and the Thermflow™ T443 demonstrated a thermal resistance of about 0.9° C./W. Thus, the embodiment of the present invention has a considerable thermal conduction advantage over the Thermflow™ T443.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A device assembly, comprising:
   a heat source;
   a heat dissipation device; and
   a thermal interface, disposed between said heat source and said heat dissipation device, comprising a grid frame, comprising foil having openings extending therethrough, substantially coated with a thermally conductive solder material.

2. The device assembly of claim 1, wherein said thermally conductive solder material melts at a temperature at or below a temperature of said heat source.

3. The device assembly of claim 1, wherein said grid frame comprises a thermally conductive material.

4. The device assembly of claim 3, wherein said thermally conductive material selected from the group consisting of aluminum, copper, nickel, and stainless steel.

5. The device assembly of claim 1, wherein said grid frame openings comprise substantially square openings.

6. The device assembly of claim 1, wherein said thermally conductive solder material comprises about 49% Bi, about 21% In, about 18% Pb, and about 12% Sn.

7. The device assembly of claim 1, wherein said thermally conductive solder material comprises about 51% In, about 32.5% Bi, and about 16.5% Sn.

8. A microelectronic device assembly, comprising:
   a microelectronic die;
   a heat dissipation device; and
   a thermal interface, disposed between said heat source and said heat dissipation device, comprising a grid frame, comprising foil having openings extending therethrough, substantially coated with a thermally conductive solder material.

9. The microelectronic device assembly of claim 8, wherein said thermally conductive solder material melts at a temperature at or below an operating temperature of said microelectronic die.

10. The microelectronic device assembly of claim 8, wherein said thermally conductive interface material is substantially solid at room temperature.

11. The microelectronic device assembly of claim 8, wherein said grid frame comprises a thermally conductive material.

12. The microelectronic device assembly of claim 8, wherein said thermally conductive material selected from the group consisting of aluminum, copper, nickel, and stainless steel.

13. The microelectronic device assembly of claim 8, wherein said grid frame openings comprise substantially square openings.

14. The microelectronic device assembly of claim 8, wherein said thermally conductive solder material comprises about 49% In, about 21% In, about 18% Pb, and about 12% Sn.

15. The microelectronic device assembly of claim 8, wherein said thermally conductive solder material comprises about 51% In, about 32.5% Bi, and about 16.5% Sn.

16. The microelectronic device assembly of claim 8, further including a support structure which induces a positive pressure between the microelectronic die and the heat dissipation device.

17. A thermal interface, comprising:
   a grid frame comprising foil having openings extending therethrough; and
   a thermally conductive solder material substantially coating said grid frame.

18. The thermal interface of claim 17, wherein said grid frame comprises a thermally conductive material.

19. The thermal interface of claim 18, wherein said thermally conductive material selected from the group consisting of aluminum, copper, nickel, and stainless steel.

20. The thermal interface of claim 17, wherein said grid frame openings comprise substantially square openings.

21. The thermal interface of claim 17, wherein said thermally conductive solder material comprises about 49% Bi, about 21% In, about 18% Pb, and about 12% Sn.

22. The thermal interface of claim 17, wherein said thermally conductive solder material comprises about 51% In, about 32.5% Bi, and about 16.5% Sn.

* * * * *